United States Patent
Lee et al.

(10) Patent No.: US 11,115,006 B1
(45) Date of Patent: Sep. 7, 2021

(54) INTERNAL LATCH CIRCUIT AND METHOD FOR GENERATING LATCH SIGNAL THEREOF

(71) Applicant: Integrated Silicon Solution Inc., Milpitas, CA (US)

(72) Inventors: Kangmin Lee, Milpitas, CA (US); Sangmin Jun, Milpitas, CA (US); Youngjin Yoon, Milpitas, CA (US); Seung Cheol Bae, Milpitas, CA (US); Kwang Kyung Lee, Milpitas, CA (US); Sun Byeong Yoon, Milpitas, CA (US)

(73) Assignee: Integrated Silicon Solution Inc., Milpitas, CA (US)

( * ) Notice: Subject to any disclaimer, the term of this patent is extended or adjusted under 35 U.S.C. 154(b) by 0 days.

(21) Appl. No.: 17/079,219

(22) Filed: Oct. 23, 2020

(51) Int. Cl.
*H03K 3/037* (2006.01)
*H03K 5/13* (2014.01)
*G11C 11/4076* (2006.01)

(52) U.S. Cl.
CPC .......... *H03K 3/037* (2013.01); *G11C 11/4076* (2013.01); *H03K 5/13* (2013.01)

(58) Field of Classification Search
CPC .. G11C 11/4076; H03K 3/037; H03K 3/0375; H03K 5/13

USPC ......... 327/225; 365/189.011, 189.04, 189.05
See application file for complete search history.

(56) References Cited

U.S. PATENT DOCUMENTS

| | | | |
|---|---|---|---|
| 2001/0046163 A1* | 11/2001 | Yanagawa | G11C 7/22 365/194 |
| 2002/0172090 A1* | 11/2002 | Kim | G11C 7/1078 365/233.1 |
| 2006/0245101 A1* | 11/2006 | Do | G11C 7/1087 360/48 |

* cited by examiner

*Primary Examiner* — William Hernandez
(74) *Attorney, Agent, or Firm* — Lin & Associates IP, Inc.

(57) ABSTRACT

An internal latch circuit having a plurality of low initial value D flip-flops, a plurality of high initial value D flip-flops, an internal latch signal generating circuit and a NAND gate, and a method for generating latch signal thereof is provided. First, an input delay signal in response to a clock signal is generated. Then, a first internal input signal, a first reverse internal input signal, a second internal input signal, and a second reverse internal input signal are generated by using the low initial value D flip-flops and the high initial value D flip-flops, based on the internal data strobe signal and in response to the input delay signal, and are transmitted to the internal latch signal generating circuit. Then, the internal latch signal generating circuit outputs the first reverse pre-output signal and the second reverse pre-output signal. Finally, an internal latch signal is generated through a NAND gate.

10 Claims, 10 Drawing Sheets

INTERNAL LATCH CIRCUIT AND METHOD FOR GENERATING LATCH SIGNAL THEREOF

BACKGROUND OF THE INVENTION

1. Field of the Invention

The present invention relates to an internal latch circuit, and in particular to an internal latch circuit and a method for generating latch signal thereof.

2. The Prior Arts

Synchronous dynamic random access memory (SDRAM) is a kind of volatile memory, which is characterized by that SDRAM is designed to synchronize with timing of the central processing unit, so that the memory controller can obtain correct clock cycle spent for preparing the required data, thus it's not needed to delay the next data access of the central processing unit. The double data rate SDRAM (DDR SDRAM) is a new generation of synchronous dynamic random access memory technology. The double data rate of the double data rate SDRAM means that it can be read or write twice in a single cycle. When core clock is unchanged, a transmission efficiency of the double data rate SDRAM is twice as effective as that of synchronous dynamic random access memory.

In the technology of the double data rate SDRAM, data strobe signal (DQS) is an important technology, which is mainly used to accurately distinguish each transmission cycle within one clock cycle, so that receiver can accurately receive information. In addition, when the double data rate SDRAM performs a write operation, the DQS and the write signal cannot be written into the memory immediately, but a delay is required, so the delay time cycle is defined the delay time tDQSS of write command relative to the first corresponding rising edge of DQS. In order to perform the write operation stably under standard specification, the minimum value (tCK×0.75) and maximum value (tCK×1.25) of tDQSS are specified.

Please refer to FIGS. 1 and 2, FIG. 1 is a schematic circuit block diagram of the internal latch circuit of the prior art. FIG. 2 is a schematic diagram illustrating change of rising edge and falling edge of the input delay signal. In the double data transfer rate synchronous dynamic random access memory technology, the prior art will generate a latch signal to ensure the stable performance of the write operation. However, due to the temperature of the external environment or manufacturing technology of the metal oxide semiconductor field effect transistor, the delay time tDQSS of the input delay signal is caused to change. More specifically, the rising edge and falling edge of the input delay signal change due to the temperature of the external environment or the manufacturing technology. As shown in FIG. 2, the input delay signal WR_LAT_P1 is the input delay signal when the delay time tDQSS is normal, the first input delay signal WR_LAT_P1 #1 is the input delay signal generated when the delay time tDQSS is too short, the second input delay signal WR_LAT_P1 #2 is the input delay signal generated when the delay time tDQSS is too long. Since the rising and falling edges of the input delay signal WR_LAT_P1 change, the latch signal generated by the internal latch circuit of the prior art shown in FIG. 1 is subject to influence of the rising and falling edges of the delay signal WR_LAT_P1 and will not generate the latch signal correctly, thus the double data rate SDRAM is caused to be unable to perform the write operation stably.

Therefore, the present invention is provided after observing the above-mentioned deficiencies.

SUMMARY OF THE INVENTION

The present invention is purposed to provide a internal latch circuit using a plurality of low initial value D flip-flops and a plurality of high initial value D flip-flops to generate a first internal input signal, a first reverse internal input signal, a second internal input signal, and a second reverse internal input signal, based on the internal data strobe signal and in response to the input delay signal, and to transmit the first internal input signal, the first reverse internal input signal, the second internal input signal, and the second reverse internal input signal to the internal latch signal generating circuit. Then, the internal latch signal generating circuit outputs the first reverse pre-output signal and the second reverse pre-output signal. Finally, an internal latch signal is generated through a NAND gate. In this way, influence of the delay time tDQSS of the input delay signal on the internal latch signal is eliminated to ensure stable performance of memory write operation, and reduce influence of the delay time tDQSS on stable performance of memory write operation.

In order to achieve the purpose above, the present invention provides an internal latch circuit including a first delay circuit receiving an input delay signal and an internal data strobe signal, and outputting a first internal input signal, wherein the input delay signal responds to a clock signal; a second delay circuit coupled to the first delay circuit, the second delay circuit receiving the internal data strobe signal, and outputting a first reverse internal input signal; a third delay circuit coupled to the second delay circuit, and receiving the internal data strobe signal and outputting a second internal input signal; a fourth delay circuit coupled to the third delay circuit, and receiving the internal data strobe signal and outputting a second reverse internal input signal; an internal latch signal generating circuit coupled to the first delay circuit, the second delay circuit, the third delay circuit, and the fourth delay circuit, and generating a first reverse pre-output signal according to the first internal input signal and the first reverse internal input signal, and generating a second reverse pre-output signal according to the second internal input signal and the second reverse internal input signal; an NAND gate coupled to the internal latch signal generating circuit, and generating an internal latch signal according to the first reverse pre-output signal and the second reverse pre-output signal.

Preferably, according to the internal latch circuit of the present invention, the first delay circuit, the second delay circuit, the third delay circuit, and the fourth delay circuit are implemented with at least one of D flip-flop, JK flip-flop and SR flip-flop.

Preferably, according to the internal latch circuit of the present invention, the internal latch circuit further includes a reset input terminal coupled to the first delay circuit, the second delay circuit, the third delay circuit, and the fourth delay circuit, the reset input terminal is used to input a reverse reset signal.

Further, an internal latch circuit is provided according to an embodiment of the present invention and having a plurality of low initial value D flip-flops and a plurality of high initial value D flip-flops, the internal latch circuit includes: a first low initial value D flip-flop receiving an input delay signal and an internal data strobe signal, wherein the input delay signal responds to the clock signal; a second low initial value D flip-flop coupled to the first low initial value D flip-flop, the second low initial value D flip-flop receiving the internal data strobe signal, and outputting the first internal input signal; a first high initial value D flip-flop coupled to the second low initial value D flip-flop, and the first high initial value D flip-flop receiving the internal data strobe signal; a third low initial value D flip-flop coupled to the first high initial value D flip-flop, the third low initial value D flip-flop receiving the internal data strobe signal, and outputting the first reverse internal input signal; a second high initial value D flip-flop coupled to the third low initial value D flip-flop, and the second high initial value D flip-flop receiving the internal data strobe signal; a fourth low initial value D flip-flop coupled to the second high initial value D flip-flop, the fourth low initial value D flip-flop receiving the internal data strobe signal, and outputting the second internal input signal; a third high initial value D flip-flop coupled to the fourth low initial value D flip-flop, and the third high initial value D flip-flop receiving the internal data strobe signal; a fifth low initial value D flip-flop coupled to the third high initial value D flip-flop, the fifth low initial value D flip-flop receiving the internal data strobe signal, and outputting the second reverse internal input signal; wherein the first low initial value D flip-flop and the second low initial value D flip-flop consist of the first delay circuit, the first high initial value D flip-flop and the third low initial value D flip-flop consist of the second delay circuit, the second high initial value D flip-flop and the fourth low initial value D flip-flop consist of the third delay circuit, the third high initial value D flip-flop and the fifth low initial value D flip-flop consist of the fourth delay circuit.

Preferably, according to the internal latch circuit of the present invention, wherein the low initial value D flip-flop has an input terminal, an output terminal, a reverse output terminal, and an internal data strobe input terminal.

Preferably, according to the internal latch circuit of the present invention, wherein the high initial value D flip-flop has an input terminal, an output terminal, a reverse output terminal, and an internal data strobe input terminal.

Preferably, according to the internal latch circuit of the present invention, wherein the first low initial value D flip-flop has a first input terminal, a first output terminal, a first reverse output terminal, and a first internal data strobe input terminal, the first input terminal receives the input delay signal, the first internal data strobe input terminal receives the internal data strobe signal; the second low initial value D flip-flop has a second input terminal, a second output terminal, a second reverse output terminal, and a second internal data strobe input terminal, the second input terminal is connected to the first output terminal, the second internal data strobe input terminal receives the internal data strobe signal, and the second output terminal outputs the first internal input signal; the first high initial value D flip-flop has a third input terminal, a third output terminal, a third reverse output terminal, and a third internal data strobe input terminal, wherein the third input terminal is connected the second reverse output terminal, the third internal data strobe input terminal receives the internal data strobe signal; the third low initial value D flip-flop has a fourth input terminal, a fourth output terminal, a fourth reverse output terminal, and a fourth internal data strobe input terminal, wherein the fourth input terminal is connected to the third reverse output terminal, the fourth internal data strobe input terminal receives the internal data strobe signal, and the fourth reverse output terminal outputs the first reverse internal input signal; the second high initial value D flip-flop has a fifth input terminal, a fifth output terminal, a fifth reverse output terminal, and a fifth internal data strobe input terminal, wherein the fifth input terminal is connected to the fourth reverse output terminal, the fifth internal data strobe input terminal receives the internal data strobe signal; the fourth low initial value D flip-flop has a sixth input terminal, a sixth output terminal, a sixth reverse output terminal, and a sixth internal data strobe input terminal, wherein the sixth input terminal is connected to the fifth reverse output terminal, the sixth internal data strobe input terminal receives the internal data strobe signal, the sixth output terminal outputs the second internal input signal; the third high initial value D flip-flop has a seventh input terminal, a seventh output terminal, a seventh reverse output terminal, and a seventh internal data strobe input terminal, the seventh input terminal is connected to the sixth reverse output terminal, the seventh internal data strobe input terminal receives the internal data strobe signal; the fifth low initial value D flip-flop has an eighth input terminal, an eighth output terminal, an eighth reverse output terminal, and an eighth internal data strobe input terminal, wherein the eighth input terminal is connected to the seventh reverse output terminal, the eighth internal data strobe input terminal receives the internal data strobe signal, and the eighth reverse output terminal outputs the second reverse internal input signal.

Preferably, according to the internal latch circuit of the present invention, wherein a period of the clock signal is equal to a period of the internal data strobe signal, and each of the period of the clock signal and the period of the internal data strobe signal is a time period.

Preferably, according to the internal latch circuit of the present invention, wherein a length of the input delay signal is two time periods.

Further, in order to achieve the purpose above, a method for generating a latch signal of the internal latch circuit based on the internal latch circuit of the present invention is further provided and includes steps of: step of receiving a delay signal, in which an internal latch circuit, in which an internal latch circuit receives an input delay signal and an internal data strobe signal; step of responding to the delay signal, in which a plurality of low initial value D flip-flops and a plurality of high initial value D flipflops are used to generate and transmit a first internal input signal, a first reverse internal input signal, a second internal input signal, and a second reverse internal input signal to an internal latch signal generation circuit based on the internal data strobe signal and in response to the input delay signal; step of generating an output signal, in which the internal latch signal generating circuit is used to receive the first internal input signal, the first reverse internal input signal, and a second internal input signal and a second reverse internal input signal, so that the internal latch signal generating circuit outputs a first reverse pre-output signal and a second reverse pre-output signal; step of generating an internal latch signal, in which a NAND gate is used to receive the first reverse pre-output signal and the second reverse pre-output signal to generate an internal latch signal.

Preferably, according to a method for generating the latch signal of the present invention, the first delay circuit, the second delay circuit, the third delay circuit, and the fourth delay circuit are implemented with at least one of D flip-flop, JK flip-flop and SR flip-flop.

Preferably, according to a method for generating the latch signal of the present invention, the internal latch circuit further includes a reset input terminal coupled to the first delay circuit, the second delay circuit, the third delay circuit and the fourth delay circuit. The reset input terminal is used to input a reverse reset signal.

Preferably, the present invention based on the internal latch circuit according to an preferred embodiment further provides a method for generating an latch signal, which includes: generating an input delay signal responding to the clock signal; inputting the input delay signal to the first low initial value D flip-flop and the second low initial value D flip-flop, wherein the second low initial value D flip-flop outputs the first internal input signal in response to the input delay signal based on the internal data strobe signal after two time cycles, the first internal input signal is delayed by two time cycles compared with the input delay signal; inputting the input delay signal to the first low initial value D flip-flop, the second low initial value D flip-flop, the first high initial value D flip-flop and the third low initial value D flip-flop, wherein the third low initial value D flip-flop outputs the first reverse internal input signal in response to the input delay signal based on the internal data strobe signal after four time cycles, the first reverse internal input signal is a reverse signal and delayed by four time cycles compared with the input delay signal; inputting the input delay signal to the first low initial value D flip-flop, the second low initial value D flip-flop, the first high initial value D flip-flop, the third low initial value D flip-flop, the second high initial value D flip-flop and the fourth low initial value D flip-flop, wherein the fourth low initial value D flip-flop outputs the second internal input signal in response to the input delay signal based on the internal data strobe signal after six time cycles, the second internal input signal is delayed by six time cycles compared with the input delay signal; inputting the input delay signal to the first low initial value D flip-flop, the second low initial value D flip-flop, the first high initial value D flip-flop, the third low initial value D flip-flop, the second high initial value D flip-flop, the fourth low initial value D flip-flop, the third high initial value D flip-flop and the fifth low initial value D flip-flop, wherein the fifth low initial value D flip-flop outputs the second reverse internal input signal in response to the input delay signal based on the internal data strobe signal after eight time cycles, the second reverse internal input signal is a reverse signal and delayed by eight time cycles compared with the input delay signal; inputting the first internal input signal and the first reverse internal input signal to the internal latch signal generating circuit to generate the first reverse pre-output signal, and inputting the second internal input signal and the second reverse internal input signal to the internal latch signal generating circuit to generate the second reverse pre-output signal; inputting the first reverse pre-output signal and the second reverse pre-output signal to the NAND gate, and generating the internal latch signal.

Preferably, according to the method of the present invention for generating the latch signal, the low initial value D flip-flops and the high initial value D flip-flops all have an input, an output, and a reverse output terminal, and an internal data strobe input terminal.

Preferably, according to the method for generating the latch signal of the present invention, wherein a length of the input delay signal is two time periods, and a length of the internal latch signal is two time periods.

Preferably, according to the method for generating the latch signal of the present invention, wherein a length of the input delay signal is not two time periods, and a length of the internal latch signal is two time periods.

In summary, the internal latch circuit and latch signal generation method provided by the present invention are mainly based on the internal data strobe signal and only use the rising edge response of the input delay signal to generate the internal latch signal, thereby eliminate the influence of the input delay signal to the internal latch signal to ensure stable performance of write operation of the memory.

In order to enable those skilled in the art to understand the purpose, features, and effects of the present invention, the following specific embodiments and accompanying drawings are used to explain the present invention in detail as follows.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Figure 1:
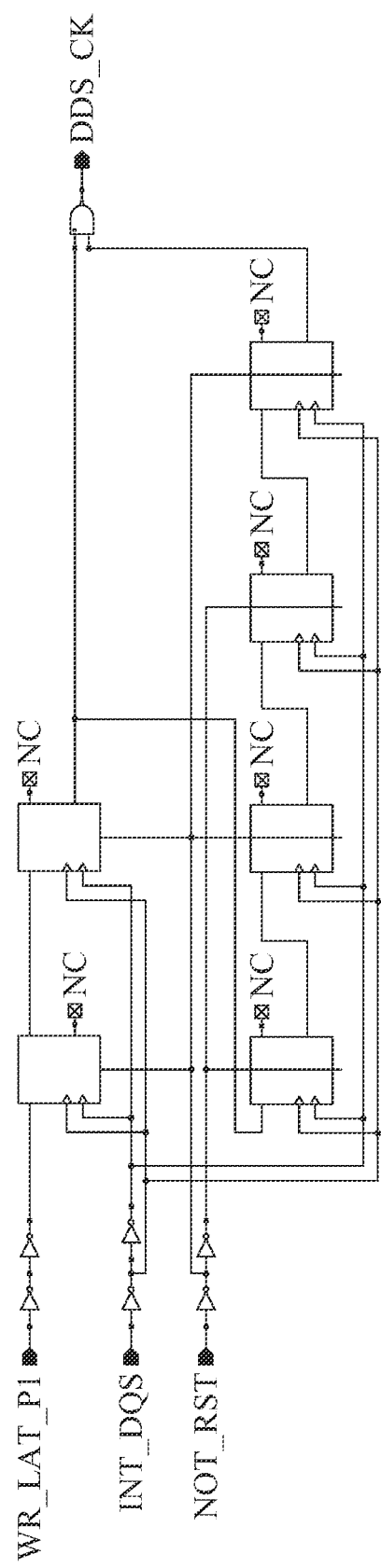
FIG. 1 is a schematic circuit block diagram of the internal latch circuit of the prior art.
Figure 2:
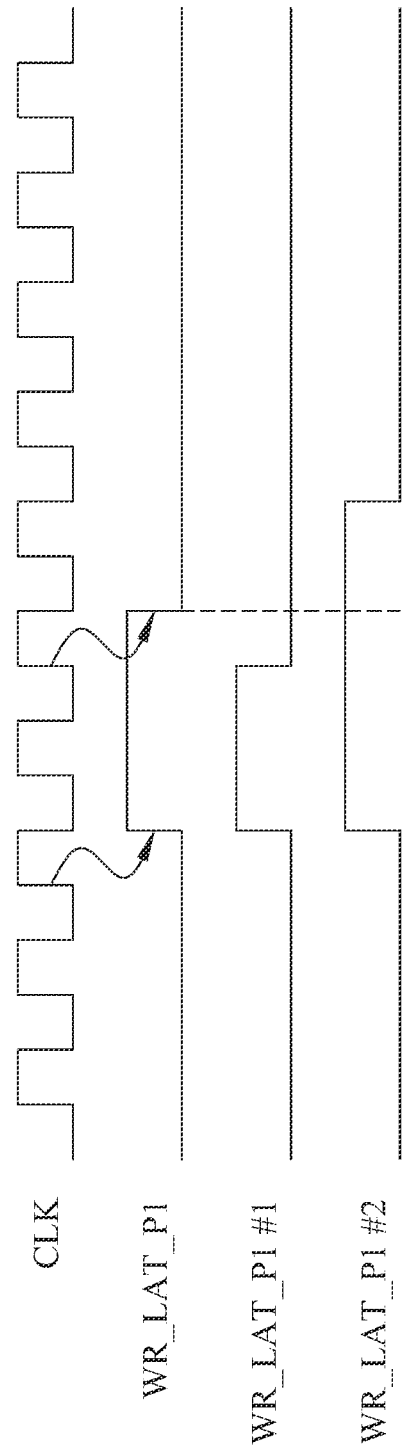
FIG. 2 is a schematic diagram illustrating change of the rising edge and the falling edge of the input delay signal.

The present invention will now be explained more fully hereinafter with reference to the accompanying diagrams which illustrate exemplary embodiments of the present invention. The advantages and features of the concept of the present invention and the method of achieving the same will be apparent by the exemplary embodiments described in more detail with reference to the accompanying diagrams. However, it should be noted that the present invention is not limited to the following exemplary embodiments, but can be implemented in various forms. Therefore, the exemplary embodiments are only provided for disclosing the concept of the present invention and making those skilled in the art understand the category of the concept of the present invention. In the diagrams, the exemplary embodiments of the present invention are not limited to the specific examples provided herein and are enlarged for clarity.

The terms used herein are only used to illustrate specific embodiments, and are reverse intended to limit the present invention. Unless the context clearly indicates otherwise, the singular terms "a, an" and "the" used herein are intended to also include plural form. The term "and/or" used herein includes any and all combinations of one or more of the related listed items. It should be understood that when an element is referred to as being "connected" or "coupled" to another element, the element may be directly connected or coupled to the another element or intermediate elements may be present.

Similarly, it should be understood that when an element (such as a layer, region, or substrate) is referred to be "on" another element, the element may be directly on the other element, or there may be an intermediate element. In contrast, the term "directly" means that there is no intermediate element. It should be understood that when the terms "comprises/comprising" and "includes and/or including" are used in this context, the terms indicate the presence of the stated features, integers, steps, operations, elements, and/or components while it is not excluded that the presence or addition of one or more other features, integers, steps, operations, elements, components, and/or groups thereof.

In addition, exemplary embodiments in the detailed description will be explained by a section view as an idealized exemplary diagram of the present invention. Correspondingly, the shape of the exemplary diagram can be modified according to manufacturing technology and/or allowable errors. Therefore, the exemplary embodiments of the present invention are not limited to the specific shapes shown in the exemplary diagrams, but may include other shapes that can be generated according to the manufacturing process. The regions illustrated in the diagrams have general characteristics and are used to illustrate the specific shape of the element. Therefore, this should not be regarded as limiting the scope of the present invention.

It should also be understood that although the terms "first", "second", "third", etc. may be used herein to describe various elements, these elements should not be limited to these terms. These terms are only used to distinguish each element. Therefore, the first element in some embodiments may be referred to as the second element in other embodiments without departing from the teachings of the present invention. The exemplary embodiments of aspects of the present invention illustrated and described herein include complementary counterparts thereof. Throughout this specification, the same reference number or the same indicator represents the same element.

In addition, the exemplary embodiments are described herein with reference to section views and/or plan views, wherein the section views and/or plan views are idealized exemplary illustrations. Therefore, it is expected that there is a deviation from the illustrated shape resulting from, for example, manufacturing technology and/or tolerances. Therefore, the exemplary embodiments should not be viewed as being limited to the shapes of the regions shown herein, but are intended to include shape deviations caused by, for example, manufacturing. For example, an etched region depicted as a rectangle will generally have round or curved feature. Therefore, the regions shown in the diagrams are schematic, and the shapes thereof are reverse intended to illustrate the actual shapes of the regions of the device, or to limit the scope of the exemplary embodiments.

As understood by the inventive entity, the device and the method of forming the device according to the various exemplary embodiments described herein can be implemented in microelectronic devices such as integrated circuits, wherein the multiple devices according to the various exemplary embodiments described herein are integrated in the same microelectronic device. Therefore, the sectional view shown herein can be replicated in two different directions in the microelectronic device, and the two different directions are reverse required to be orthogonal. Therefore, a plan view of the microelectronic device implementing the device according to various exemplary embodiments described herein may include a plurality of devices in the form of an array and/or a two-dimensional pattern based on the functionality of the microelectronic device.

Therefore, the section views shown herein provide support for a plurality of devices according to various exemplary embodiments described herein that extend in two different directions in plan view and/or in three different directions in perspective view.

Figure 3:
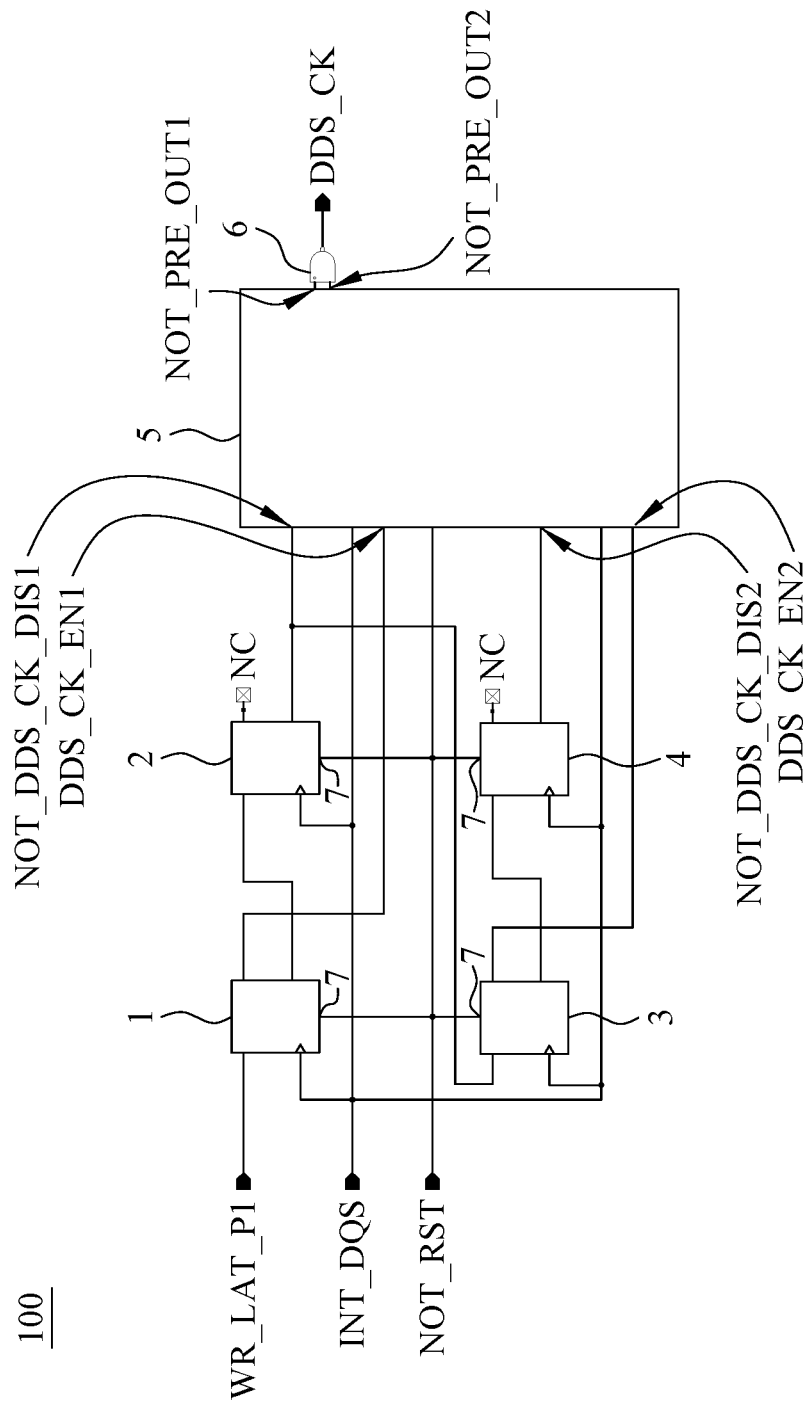
FIG. 3 is a schematic circuit block diagram of an internal latch circuit according to the present invention.

Please refer to FIGS. 3 to 7, FIG. 3 is a schematic circuit block diagram of an internal latch circuit according to the present invention. As shown in FIG. 3, an internal latch circuit 100 according to the present invention includes a first delay circuit 1, a second delay circuit 2, a third delay circuit 3, a fourth delay circuit 4, an internal latch signal generating circuit 5 and a NAND gate 6.

Specifically, the first delay circuit 1 receives an input delay signal WR_LAT_P1 and an internal data strobe signal INT_DQS, and outputs a first internal input signal DDS_CK_EN1, wherein the input delay signal WR_LAT_P1 responds to a clock signal CLK.

Specifically, the second delay circuit 2 is coupled to the first delay circuit 1, the second delay circuit 2 receives the internal data strobe signal INT_DQS, and outputs a first reverse internal input signal NOT_DDS_CK_DIS1.

Specifically, the third delay circuit 3 is coupled to the second delay circuit 2, and receives the internal data strobe signal INT_DQS and outputs a second internal input signal DDS_CK_EN2.

Specifically, the fourth delay circuit 4 is coupled to the third delay circuit 3, and receives the internal data strobe signal INT_DQS and outputs a second reverse internal input signal NOT_DDS_CK_DIS2.

Specifically, the internal latch signal generating circuit 5 is coupled to the first delay circuit 1, the second delay circuit 2, the third delay circuit 3, and the fourth delay circuit 4, and receives the first internal input signal DDS_CK_EN1, the first reverse internal input signal NOT_DDS_CK_DIS1, the second internal input signal DDS_CK_EN2, and the second reverse internal input signal NOT_DDS_CK_DIS2, and generates a first reverse pre-output signal NOT_PRE_OUT1 and a second reverse pre-output signal NOT_PRE_OUT2.

Specifically, the NAND gate 6 is coupled to the internal latch signal generating circuit 5. The NAND gate 6 receives the first reverse pre-output signal NOT_PRE_OUT1 and the second reverse pre-output signal NOT_PRE_OUT2, and the NAND gate 6 outputs an internal latch signal DDS_CK.

Specifically, according to the above structure, the first delay circuit 1, the second delay circuit 2, the third delay circuit 3, and the fourth delay circuit 4 may implement with at least one of D flip-flop, JK flip-flop, and SR flip-flop used.

Specifically, the internal latch circuit 100 may further include a reset input terminal 7 coupled to the first delay circuit 1, the second delay circuit 2, the third delay circuit 3, and the fourth delay circuit 4, the reset input terminal 7 is used to input a reverse reset signal NOT RST, wherein the reset signal NOT RST is used to reset the values of the low initial value D flip-flops 10 and the high initial value D flip-flops 20, but the present invention is not limited to this.

In order to further understand the structural features of the present invention, the use of technical means and the expected effects, the embodiments of the present invention are described. It is believed that the present invention can be understood more deeply and specifically from the following description.

Figure 4:
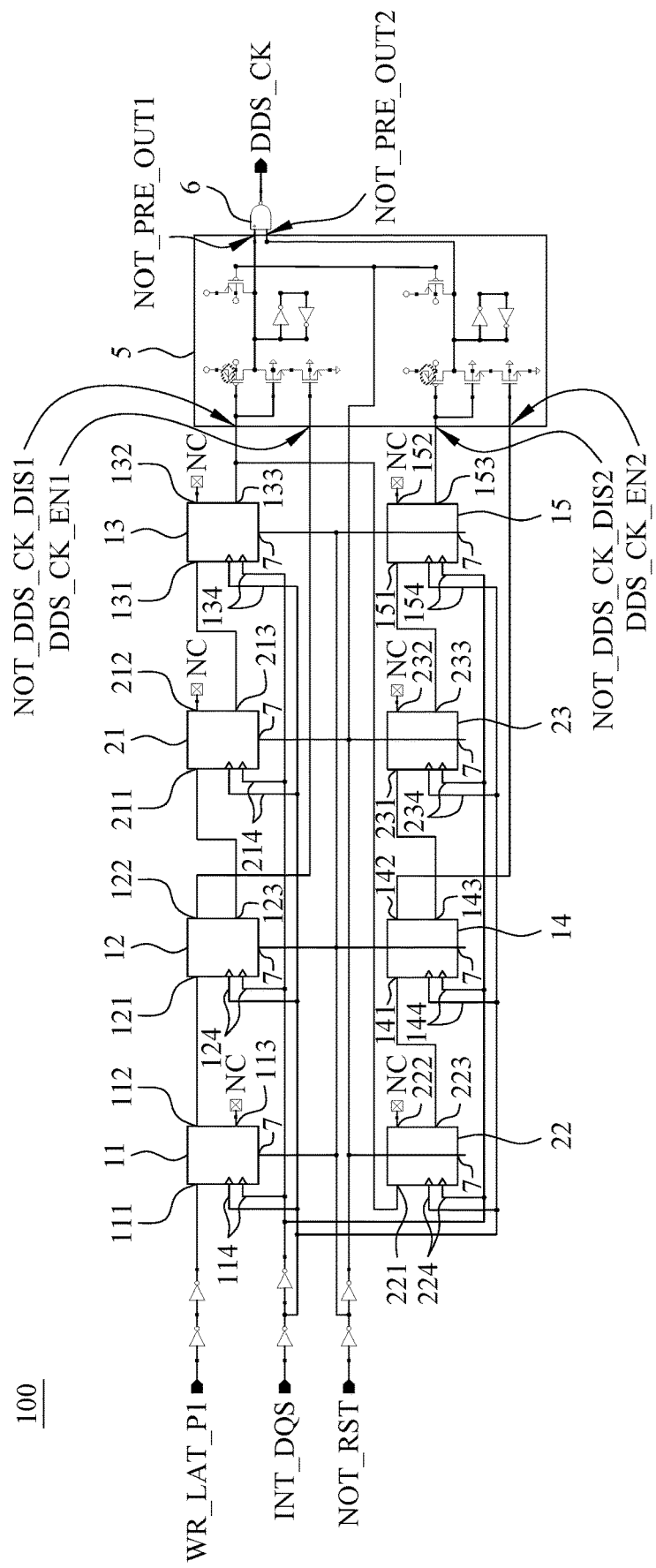
FIG. 4 is a schematic circuitry block diagram of an internal latch circuit according to one or more exemplary embodiments of the present invention.

Please refer to FIG. 4, FIG. 4 is a schematic circuitry block diagram of an internal latch circuit according to one or more exemplary embodiments of the present invention. As shown in FIG. 4, an internal latch circuit 100 according to an embodiment of the present invention has a plurality of low initial value D flip-flops 10 and a plurality of high initial value D flip-flops 20, the internal latch circuit 100 includes the first low initial value D flip-flop 11, the second low initial value D flip-flop 12, the first high initial value D flip-flop 21, the third low initial value D flip-flop 13, the second high initial value D flip-flop 22, the fourth low initial value D flip-flop 14, the third high initial value D flip-flop 23, and the fifth low initial value D flip-flop 15, an internal latch signal generating circuit 5 and a NAND gate 6.

Specifically, in the embodiment, the first low initial value D flip-flop 11 receives the input delay signal WR_LAT_P1 and the internal strobe data signal INT_DQS, wherein the input delay signal WR_LAT_P1 responds to the clock signal CLK.

Specifically, in the embodiment, the second low initial value D flip-flop 12 is coupled to the first low initial value D flip-flop 11, and the second low initial value D flip-flop 12 receives the input delay signal WR_LAT_P1 through the first low initial value D flip-flop 11 and receives the internal strobe data signal INT_DQS, and the second low initial value D flip-flop 12 based on the internal strobe data INT_DQS responds to the input delay signal WR_LAT_P1 and generates the first internal input signal DDS_CK_EN1. Thereby, the second low initial value D flip-flop 12 outputs the first internal input signal DDS_CK_EN1.

Specifically, in the embodiment, the first high initial value D flip-flop 21 is coupled to the second low initial value D flip-flop 12, and the first high initial value D flip-flop 21 receives the input delay signal WR_LAT_P1 passing through the first low initial value D flip-flop 11 and the second low initial value D flip-flop 12, and receives the internal strobe data signal INT_DQS.

Specifically, in the embodiment, the third low initial value D flip-flop 13 is coupled to the first high initial value D flip-flop 21, the third low initial value D flip-flop 13 receives the input delay signal WR_LAT_P1 through the first low initial value D flip-flop 11, the second low initial value D flip-flop 12, and the first high initial value D flip-flop 21, and receives the internal strobe data signal INT_DQS, and the third low initial value D flip-flop 13 based on the internal strobe data INT_DQS responds to the input delay signal WR_LAT_P1 and generates the first reverse internal input signal NOT_DDS_CK_DIS1. Thereby, the third low initial value D flip-flop 13 outputs the first reverse internal input signal NOT_DDS_CK_DIS1.

Specifically, in the embodiment, the second high initial value D flip-flop 22 is coupled to the third low initial value D flip-flop 13, and the second high initial value D flip-flop 22 receives the input delay signal WR_LAT_P1 passing through the first low initial value D flip-flop, the second low initial value D flip-flop, the first high initial value D flip-flop 21, and the third low initial value D flip-flop 13 and receives the internal strobe data signal INT_DQS.

Specifically, in the embodiment, the fourth low initial value D flip-flop 14 is coupled to the second high initial value D flip-flop 22, and the fourth low initial value D flip-flop 14 receives the input delay signal WR_LAT_P1 passing through the first low initial value D flip-flop 11, the second low initial value D flip-flop 12, the first high initial value D flip-flop 21, and the third low initial value D flip-flop 13 and the second highest initial value D flip-flop 22, and receives the internal strobe data signal INT_DQS, and the fourth lowest initial value D flip-flop 14 based on the internal strobe data INT_DQS responds to the input delay signal WR_LAT_P1 and generates the second internal input signal DDS_CK_EN2. Thereby, the fourth low initial value D flip-flop 14 outputs the second internal input signal DDS_CK_EN2.

Specifically, in the embodiment, the third high initial value D flip-flop 23 is coupled to the fourth low initial value D flip-flop 14, and the third high initial value D flip-flop 23 receives the input delay signal WR_LAT_P1 passing through the first low initial value D flip-flop 11, the second low initial value D flip-flop 12, the first high initial value D flip-flop 21, the third low initial value D flip-flop 13, the second high initial value D flip-flop 22, and the fourth low initial value D flip-flop 14 and receives the internal strobe data signal INT_DQS.

Specifically, in the embodiment, the fifth low initial value D flip-flop 15 is coupled to the third high initial value D flip-flop 23, and the fifth low initial value D flip-flop 15 receives the input delay signal WR_LAT_P1 passing through the first low initial value D flip-flop 11, the second low initial value D flip-flop 12, the first high initial value D flip-flop 21, and the third low initial value D flip-flop 13, the second high initial value D flip-flop 22 and the third high initial value D flip-flop 23, and receives the internal strobe data signal INT_DQS, and the fourth low initial value D flip-flop 14 based on the internal strobe data INT_DQS responses to the input delay signal WR_LAT_P1 and generates a second reverse internal input signal NOT_DDS_CK_DIS2. Thereby, the fifth low initial value D flip-flop 15 outputs the second reverse internal input signal NOT_DDS_CK_DIS2.

Specifically, in the embodiment, the internal latch signal generating circuit 5 is coupled to the second low initial value D flip-flop 12, the third low initial value D flip-flop 13, the fourth low initial value D flip-flop 14 and the fifth low initial value D flip-flop 15, the internal latch signal generating circuit 5 receives the first internal input signal DDS_CK_EN1, the first reverse internal input signal NOT_DDS_CK_DIS1, the second internal input signal DDS_CK_EN2, and the second reverse internal input signal NOT_DDS_CK_DIS2, and the internal latch signal generating circuit 5 generates the first reverse pre-output signal NOT_PRE_OUT1 and the second reverse pre-output signal NOT_PRE_OUT2.

Specifically, in the embodiment, the NAND gate 6 is coupled to the internal latch signal generating circuit 5, and the NAND gate 6 receives the first reverse pre-output signal NOT_PRE_OUT1 and the second reverse pre-output signal NOT_PRE_OUT2, and the NAND gate 6 outputs the internal latch signal DDS_CK.

Specifically, in the embodiment, the first low initial value D flip-flop 11 and the second low initial value D flip-flop 12 constitute the first delay circuit 1, the first high initial value D flip-flop 21 and the third low initial value D flip-flop 13 constitute the second delay circuit 2, the second high initial value D flip-flop 22 and the fourth low initial value D flip-flop 14 constitute the third delay circuit 3, the third high initial value D flip-flop 23 and the fifth low initial value D flip-flop 15 constitute the fourth delay circuit 4.

Specifically, in the embodiment, the internal latch circuit 100 may further include a reset input terminal 7, which is coupled to the first low initial value D flip-flop 11, the second low initial value D flip-flop 12, the first high initial value D flip-flop 21, the third low initial value D flip-flop 13, the second high initial value D flip-flop 22 and third high initial value D flip-flop 23. The reset input terminal 7 is used to input a reverse reset signal NOT RST. The reset signal NOT RST is used to reset the values of the low initial value D flip-flops 10 and the high initial value D flip-flop 20, but the present invention is not limited to this.

Figure 5:
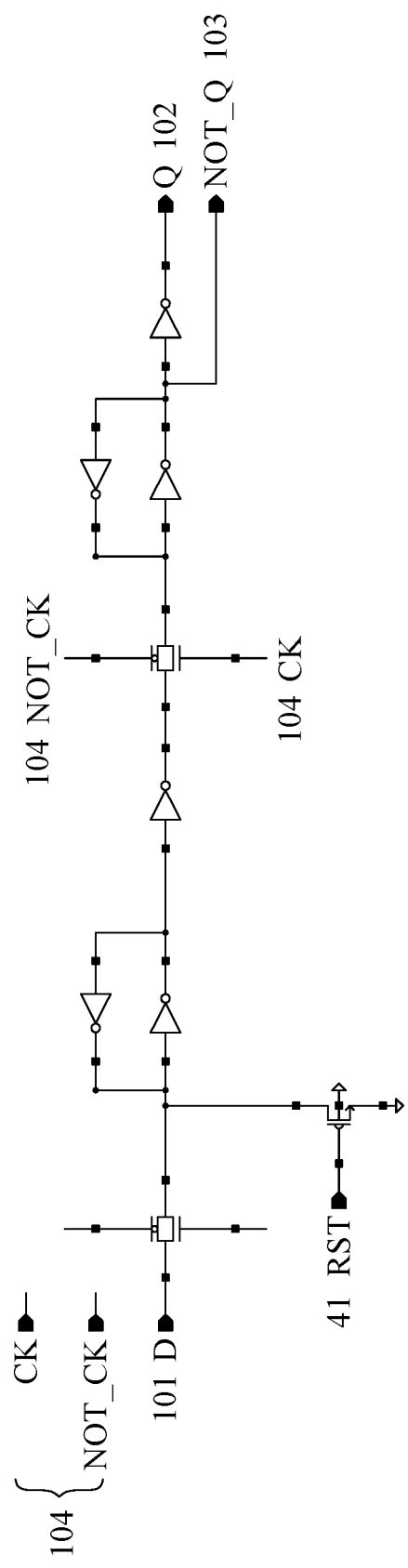
FIG. 5 is a schematic circuit diagram of a high initial value D flip-flop according to one or more exemplary embodiments of the present invention.
Figure 6:
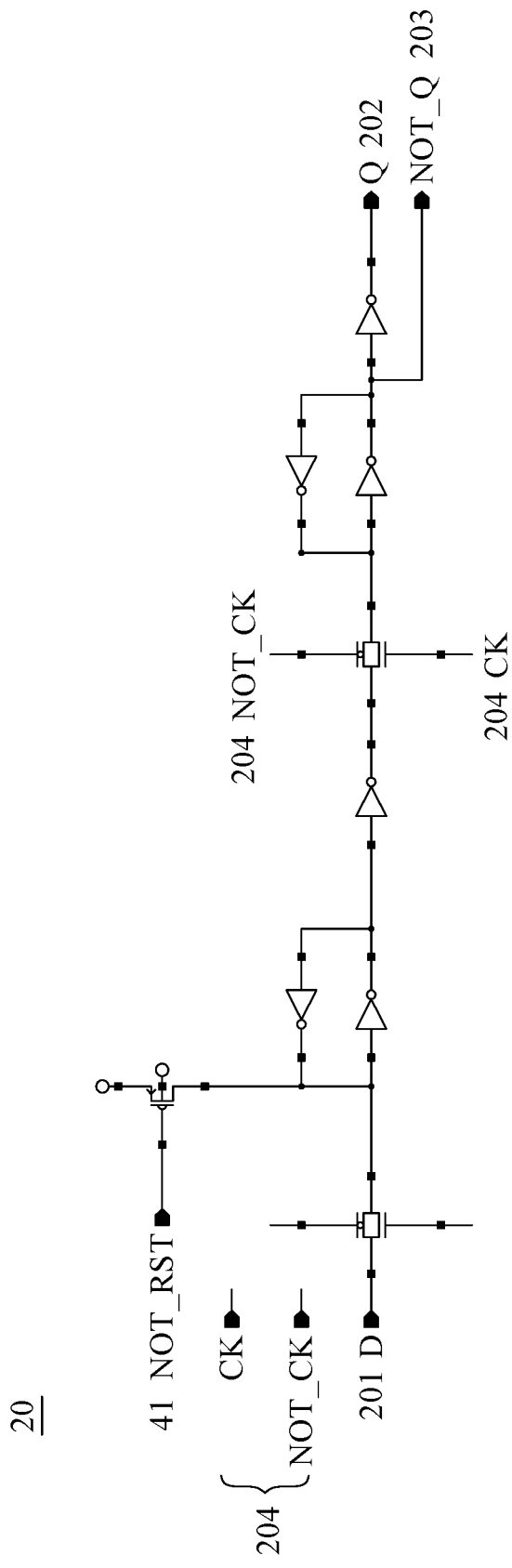
FIG. 6 is a schematic circuit diagram of a low initial value D flip-flop according to one or more exemplary embodiments of the present invention.

Please refer to FIGS. 5 and 6, FIG. 5 is a schematic circuit diagram of a low initial value D flip-flop according to one or more exemplary embodiments of the present invention; FIG. 6 is a schematic circuit diagram of a high initial value D flip-flop according to one or more exemplary embodiments of the present invention. The low initial value D flip-flop 10 according to the present invention has an input terminal 101, an output terminal 102, a reverse output terminal 103, and an internal strobe data input terminal 104. The high initial value D flip-flop 20 according to the present invention has an input terminal 201, an output terminal 202, a reverse output terminal 203, and an internal strobe data input terminal 204, it needs to be further explained that the difference between the low initial value D flip-flop 10 and the high initial value D flip-flop 20 in the embodiment is that the initial value of the low initial value D flip-flop 10 is a low value L, and the initial value of the high initial value D flip-flop 20 is a high value H.

Specifically, in the embodiment, the function of the low initial value D flip-flop 10 and the high initial value D flip-flop 20 is to receive the signal input to the input terminal 101 and the input terminal 201, and makes the received signal input to the receiving input terminal 101 and the input terminal 201 synchronized with the internal strobe data signal INT_DQS based on the internal strobe data signal INT_DQS received by the internal strobe data input terminal 104 and the internal strobe data input terminal 204, but the present invention is not limited to this.

Specifically, in the embodiment, the first low initial value D flip-flop 11 has a first input terminal 111, a first output terminal 112, a first reverse output terminal 113, and a first internal strobe data input terminal 114, wherein the first input terminal 111 receives the input delay signal WR_LAT_P1, the first internal strobe data input terminal 114 receives the internal strobe data signal INT_DQS, so that the first low initial value D flip-flop 11 based on the internal strobe data signal INT_DQS responds to the input delay signal WR_LAT_P1 and generates the output signal of the first low initial value D flip-flop 11, which is output from the first output terminal 112 to the second low initial value D flip-flop 12, wherein the signal output by the first reverse output terminal 113 and the signal output by the first output terminal 112 have a reverse relationship.

Specifically, in the embodiment, the second low initial value D flip-flop 12 has a second input terminal 121, a second output terminal 122, a second reverse output terminal 123 and a second internal strobe data input terminal 124, wherein the second input terminal 121 is connected to the first output terminal 112, the second input terminal 121 is used to receive the input delay signal WR_LAT_P1 passing through the first low initial value D flip-flop 11, the second internal strobe data input terminal 124 is used to receive the internal strobe data signal INT_DQS, so that the second low initial value D flip-flop 12 based on the internal strobe data INT_DQS responds to the input delay signal WR_LAT_P1 and generates a first internal input signal DDS_CK_EN1, and outputs the first internal input signal DDS_CK_EN1 from the second output terminal 122, the second reverse output terminal 123 outputs a reverse signal relative to the first internal input signal DDS_CK_EN1 to the third high initial value D flip-flop 21.

Specifically, in the embodiment, the first high initial value D flip-flop 21 has a third input terminal 211, a third output terminal 212, a third reverse output terminal 213, and a third internal strobe data input terminal 214, wherein the third input terminal 211 is connected to the second reverse output terminal 124, the third internal strobe data input terminal 214 is used to receive the internal strobe data signal INT_DQS, the first high initial value D flip-flop 21 generates an output signal based on the internal strobe data signal INT_DQS, and outputs the output signal from the third reverse output terminal 213 to the third low initial value D flip-flop 13 after receiving the reverse signal relative to the first internal input signal DDS_CK_EN1.

Specifically, in the embodiment, the third low initial value D flip-flop 13 has a fourth input terminal 131, a fourth output terminal 132, a fourth reverse output terminal 133, and a fourth internal strobe data input terminal 134, wherein the fourth input terminal 131 is connected to the third reverse output terminal 213 to receive the input delay signal WR_LAT_P1 passing through the first low initial value D flip-flop 11, the second low initial value D flip-flop 12 and the first high initial value D flip-flop 21, the fourth internal strobe data input terminal 134 receives the internal strobe data signal INT_DQS, so that the third low initial value D flip-flop 13 based on the internal strobe data INT_DQS responds to the input delay signal WR_LAT_P1 to generate the first reverse internal input signal NOT_DDS_CK_DIS1, and outputs the first reverse internal input signal NOT_DDS_CK_DIS1 from the fourth reverse output terminal 131.

Specifically, in the embodiment, the second high initial value D flip-flop 22 has a fifth input terminal 221, a fifth output terminal 222, a fifth reverse output terminal 223, and a fifth internal strobe data input terminal 224, wherein the fifth input terminal 221 is connected to the fourth reverse output terminal 133, the fifth internal strobe data input terminal 224 receives the internal strobe data signal INT_DQS, the second high initial value D flip-flop 22 generates an output signal based on the internal strobe data signal INT_DQS, and outputs the output signal from the fifth reverse output terminal 223 to the fourth low initial value D flip-flop 14 after receiving the first reverse internal input signal NOT_DDS_CK_DIS1.

Specifically, in the embodiment, the fourth low initial value D flip-flop 14 has a sixth input terminal 141, a sixth output terminal 142, a sixth reverse output terminal 143, and a sixth internal strobe data input terminal 144, wherein the sixth input terminal 141 is connected to the fifth reverse output terminal 223 to receive the input delay signal WR_LAT_P1 passing through the first low initial value D flip-flop 11, the second low initial value D flip-flop 12, the first high initial value D flip-flop 21, the third low initial value D flip-flop 13, and the second high initial value D flip-flop 22, the sixth internal strobe data input terminal 144 receives the internal strobe data signal INT_DQS, so that the fourth low initial value D flip-flop 14 based on the internal strobe data INT_DQS responds to the input delay signal WR_LAT_P1 to generate a second internal input signal DDS_CK_EN2 and outputs the second internal input signal DDS_CK_EN2 from the sixth output terminal 142.

Specifically, in the embodiment, the third high initial value D flip-flop 23 has a seventh input terminal 231, a seventh output terminal 232, a seventh reverse output terminal 233, and a seventh internal strobe data input terminal 234, wherein the seventh input terminal 231 is connected to the sixth reverse output terminal 143, the seventh internal strobe data input terminal 234 receives the internal strobe data signal INT_DQS, the third high initial value D flip-flop 23 generates an output signal based on the internal strobe data signal INT_DQS, and outputs the output signal from the seventh reverse output terminal 233 to the fifth low initial value D flip-flop 15 after receiving the reverse signal relative to the second internal input signal DDS_CK_EN2.

Specifically, in the embodiment, the fifth low initial value D flip-flop 15 has an eighth input terminal 151, an eighth output terminal 152, an eighth reverse output terminal 153, and an eighth internal strobe data input terminal 154, wherein the eighth input terminal 151 is connected to the seventh reverse output terminal 233 to receive the input the delay signal WR_LAT_P1 passing through the first low initial value D flip-flop 11, the second low initial value D flip-flop 12, the first high initial value D flip-flop 21, the third low initial value D flip-flop 13, the second high initial value D flip-flop 22, and the third high initial value D flip-flop 23, the eighth internal strobe data input 154 receives the internal strobe data signal INT_DQS, so that the fifth low initial value D flip-flop 15 based on the internal strobe data INT_DQS responds to the input delay signal WR_LAT_P1 to generate the second reverse internal input signal NOT_DDS_CK_DIS2, and outputs the second reverse internal input signal NOT_DDS_CK_DIS2 from the eighth reverse output terminal 153.

Specifically, in the embodiment, the cycle of the clock signal CLK is equal to the cycle of the internal strobe data signal INT_DQS, and the cycle of the clock signal and the cycle of the internal strobe data signal are both a time cycle tCK. However, the present invention is not limited to this.

Specifically, in the embodiment, the length of the input delay signal WR_LAT_P1 is two time cycles tCK, but the present invention is not limited to this.

In this way, it can be seen from the above description that the internal latch circuit 100 provided according to the present invention receives the input delay signal WR_LAT_P1 in response to the clock signal CLK, and responds to the input delay signal WR_LAT_P1 based on the internal strobe data signal INT_DQS by the low initial value D flip-flop 10 and the high initial value D flip-flops 20 to generate and transmit the first internal input signal DDS_CK_EN1, the first Reverse internal input signal NOT_DDS_CK_DIS1, the second internal input signal DDS_CK_EN2 and the second Reverse internal input signal NOT_DDS_CK_DIS2 to the internal latch signal generating circuit 5, so that the internal latch signal generating circuit 5 is used to output the first reverse pre-output signal NOT_PRE_OUT1 and the second Reverse pre-output signal NOT_PRE_OUT2, and the internal latch signal DDS_CK is finally generated through the NAND gate. It should be further explained that the internal latch circuit 100 according to the present invention is based on the internal strobe data signal INT_DQS and responds to the input delay signal WR_LAT_P1 to generate the internal latch signal DDS_CK, and the internal latch circuit 100 only responds to the rising edge of the input delay signal WR_LAT_P1 without being affected by the falling edge of the input delay signal WR_LAT_P1 while generating the internal latch signal DDS_CK.

More specifically, as to the internal latch signal DDS_CK generated by the internal latch circuit 100 of the present invention, the two-channel synchronous dynamic random access memory performs write operations stably without affected by the change of the rising edge and the falling edge of the input delay signal WR_LAT_P1 caused by the temperature of the external environment or the manufacturing technology of the metal oxide semiconductor field effect transistor. By means of the internal latch circuit 100 of the present invention, the two-channel synchronous dynamic random access memory will not be affected by the manufacturing technology and the external environment temperature, and through the accurate internal latch signal DDS_CK, the write operation can be performed stably by accurate internal latch signal DDS_CK.

Figure 7:
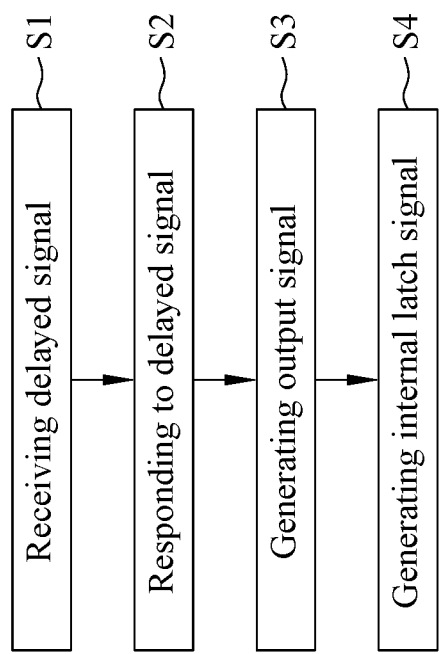
FIG. 7 is a flowchart illustrating partial steps of a method for generating the latch signal of the present invention.

In order to further understand the structural features of the present invention, the use of technical means and the expected effects, the use of the present invention is described. It is believed that the present invention can thus be understood more deeply and specifically as described in the following:

Please refer to FIG. 7 together with FIG. 3, FIG. 7 is a flowchart illustrating partial steps of a method for generating the latch signal of the present invention. The present invention further provides a method for generating the latch signal DDS_CK, which includes the following steps:

Step S1 of receiving the delay signal: the internal latch circuit 100 according to the present invention receives the input delay signal WR_LAT_P1 and the internal data strobe signal INT_DQS.

Step S2 of responding to the delay signal: using the low initial value D flip-flop 10 and the high initial value D flip-flop 20, based on the internal data strobe signal INT_DQS and in response to the input delay signal WR_LAT_P1 to generate and transmit the first internal input signal DDS_CK_EN1, the first reverse internal input signal NOT_DDS_CK_DIS1, the second internal input signal DDS_CK_EN2, and the second reverse internal input signal NOT_DDS_CK_DIS_2 to the internal latch signal generating circuit 5.

Step S3 of generating the output signal, using the internal latch signal generating circuit 5, which receives the first internal input signal DDS_CK_EN1, the first reverse internal input signal NOT_DDS_CK_DIS1, the second internal input signal DDS_CK_EN2 and the second reverse internal input signal NOT_DDS_CK_DIS_2 to make the internal latch signal generating circuit 5 output a first reverse pre-output signal and a second reverse pre-output signal.

Step S4 of generating an internal latch signal, using the NAND gate 6 which receives the first reverse pre-output signal NOT_PRE_OUT1 and the second reverse pre-output signal NOT_PRE_OUT2 to generate the internal latch signal DDS_CK.

Specifically, according to the above method for generating the latch signal DDS_CK, wherein the first delay circuit 1, the second delay circuit 2, the third delay circuit 3, and the fourth delay circuit 4 may be implemented with at least one of D flip-flop, JK flip-flop and SR flip-flop.

Specifically, according to the above method for generating the latch signal DDS_CK, wherein the internal latch circuit 100 may further include a reset input terminal 7 which is coupled to the first delay circuit 1 and the second delay circuit 2, the third delay circuit 3 and the fourth delay circuit 4, the reset input terminal 7 is used to input a reverse reset signal NOT RST, wherein the reset signal NOT RST is used to reset the values of the low initial value D flip-flop 10 and the high initial value D flip-flop 20, but the present invention is not limited thereto.

In order to further understand the structural features of the present invention, the use of technical means and the expected effects, the embodiments of the present invention are described. It is believed that the present invention can be understood more deeply and specifically from the following description.

Figure 8A:
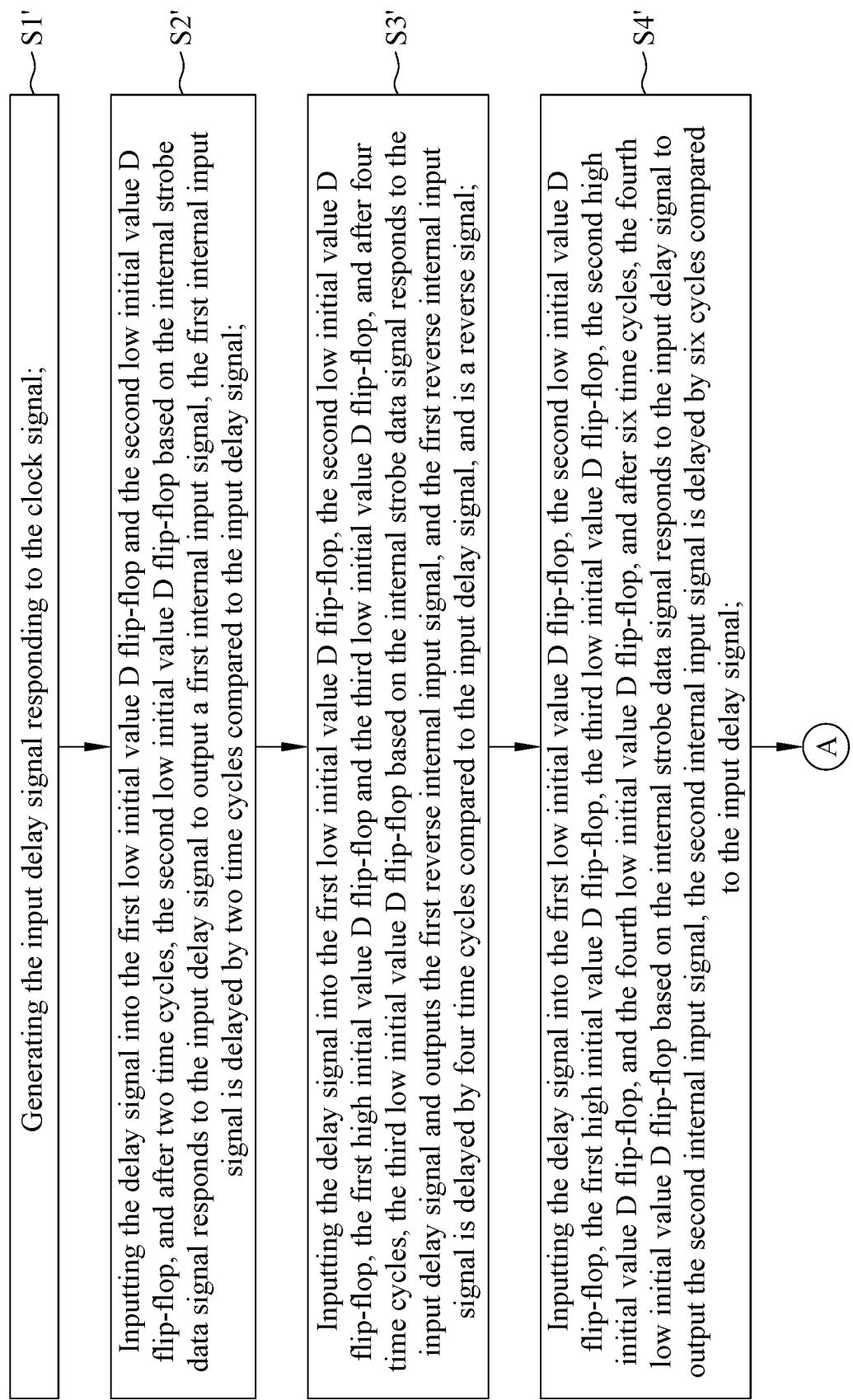
FIG. 8A is a flowchart illustrating partial steps of a method for generating the latch signal of the internal latch circuit of one or more exemplary embodiments of the present invention.
Figure 8B:
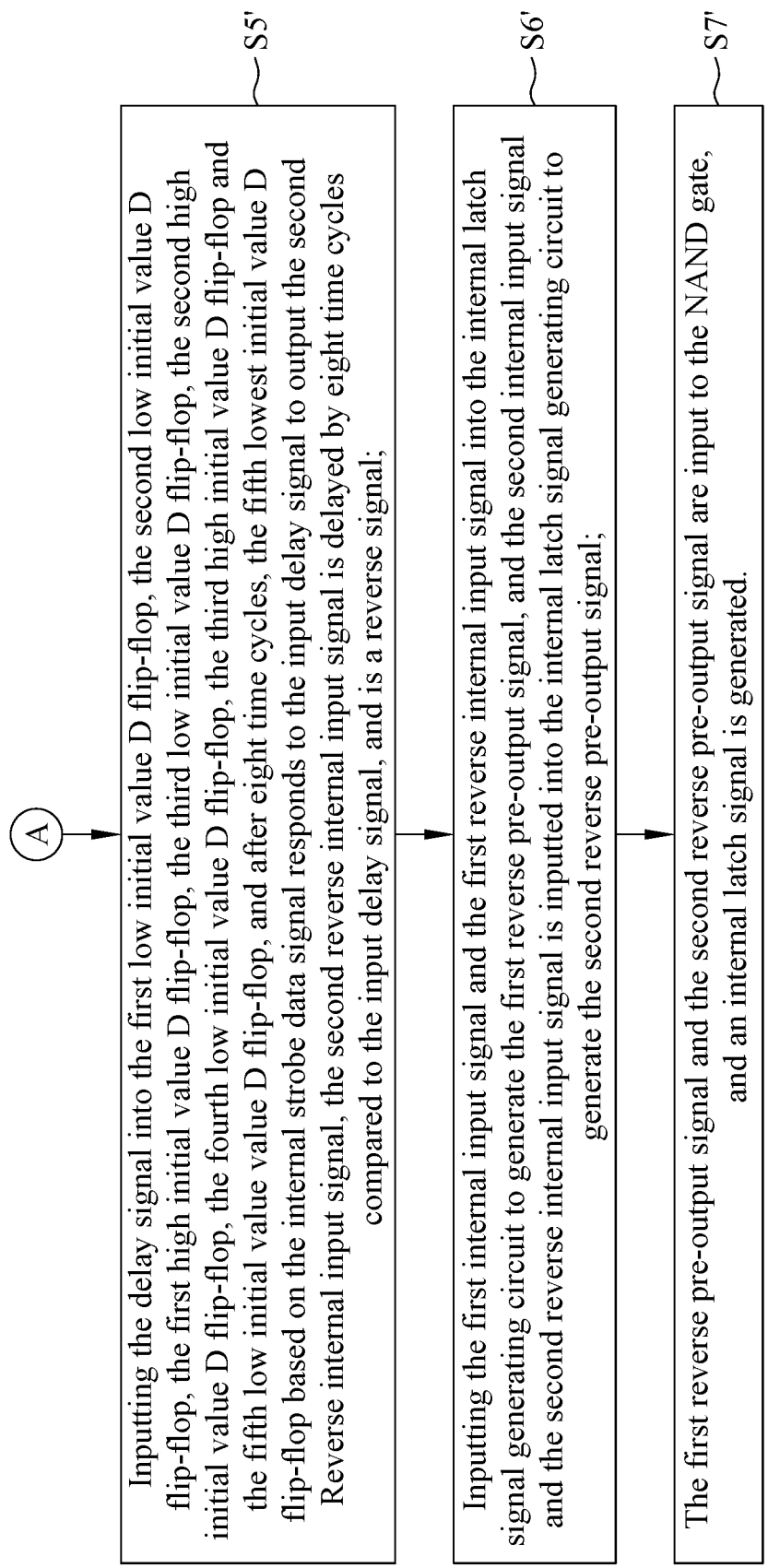
FIG. 8B is a flowchart illustrating partial steps of a method for generating the latch signal of the internal latch circuit of one or more exemplary embodiments of the present invention.

Please refer to FIG. 8A and FIG. 8B together with FIG. 4 to FIG. 6, FIG. 8A is a flowchart illustrating partial steps of a method for generating the latch signal of the internal latch circuit of one or more exemplary embodiments of the present invention; FIG. 8B is a flowchart illustrating partial steps of a method for generating the latch signal of the internal latch circuit of one or more exemplary embodiments of the present invention. The present invention is based on the internal latch circuit 100 of the above embodiment and a method for generating the latch signal DDS_CK according to the present invention further includes the following steps:

Step S1': responding to the clock signal CLK to generate an input delay signal WR_LAT_P1.

Step S2': Inputting the delay signal WR_LAT_P1 into the first low initial value D flip-flop 11 and the second low initial value D flip-flop 12, and after two time cycles tCK, the second low initial value D flip-flop 12 based on the internal strobe data signal INT_DQS responds to the input delay signal WR_LAT_P1 to output a first internal input signal DDS_CK_EN1. The first internal input signal DDS_CK_EN1 is delayed by two time cycles tCK compared to the input delay signal WR_LAT_P1.

Step S3': Inputting the delay signal WR_LAT_P1 into the first low initial value D flip-flop 11, the second low initial value D flip-flop 12, the first high initial value D flip-flop 21 and the third low initial value D flip-flop 13, and after four time cycles tCK, the third low initial value D flip-flop 13 based on the internal strobe data signal INT_DQS responds to the input delay signal and outputs the first reverse internal input signal NOT_DDS_CK_DIS1, and the first reverse internal input signal NOT_DDS_CK_DIS1 is delayed by four time cycles tCK compared to the input delay signal WR_LAT_P1, and is a reverse signal.

Step S4': Inputting the delay signal WR_LAT_P1 into the first low initial value D flip-flop 11, the second low initial value D flip-flop 12, the first high initial value D flip-flop 21, the third low initial value D flip-flop 13, the second high initial value D flip-flop 22, and the fourth low initial value D flip-flop 14, and after six time cycles tCK, the fourth low initial value D flip-flop 14 based on the internal strobe data signal INT_DQS responds to the input delay signal WR_LAT_P1 to output the second internal input signal DDS_CK_EN2. The second internal input signal is delayed by six cycles tCK compared to the input delay signal.

Step S5': Inputting the delay signal WR_LAT_P1 into the first low initial value D flip-flop 11, the second low initial value D flip-flop 12, the first high initial value D flip-flop 21, the third low initial value D flip-flop 13, the second high initial value D flip-flop 22, the fourth low initial value D flip-flop 14, the third high initial value D flip-flop 23 and the fifth low initial value D flip-flop 15, and after eight time cycles tCK, the fifth lowest initial value D flip-flop 15 based on the internal strobe data signal INT_DQS responds to the input delay signal WR_LAT_P1 to output the second Reverse internal input signal NOT_DDS_CK_DIS2, the second reverse internal input signal NOT_DDS_CK_DIS2 is delayed by eight time cycles tCK compared to the input delay signal WR_LAT_P1, and is a reverse signal.

Step S6': Inputting the first internal input signal DDS_CK_EN1 and the first reverse internal input signal NOT_DDS_CK_DIS1 into the internal latch signal generating circuit 5 to generate the first Reverse pre-output signal NOT_PRE_OUT1, and the second internal input signal DDS_CK_EN2 and the second reverse internal input signal NOT_DDS_CK_DIS2 is inputted into the internal latch signal generating circuit 5 to generate the second reverse pre-output signal NOT_PRE_OUT2.

Step S7': The first reverse pre-output signal NOT_PRE_OUT1 and the second reverse pre-output signal NOT_PRE_OUT2 are input to the NAND gate 6, and an internal latch signal DDS_CK is generated.

Figure 9:
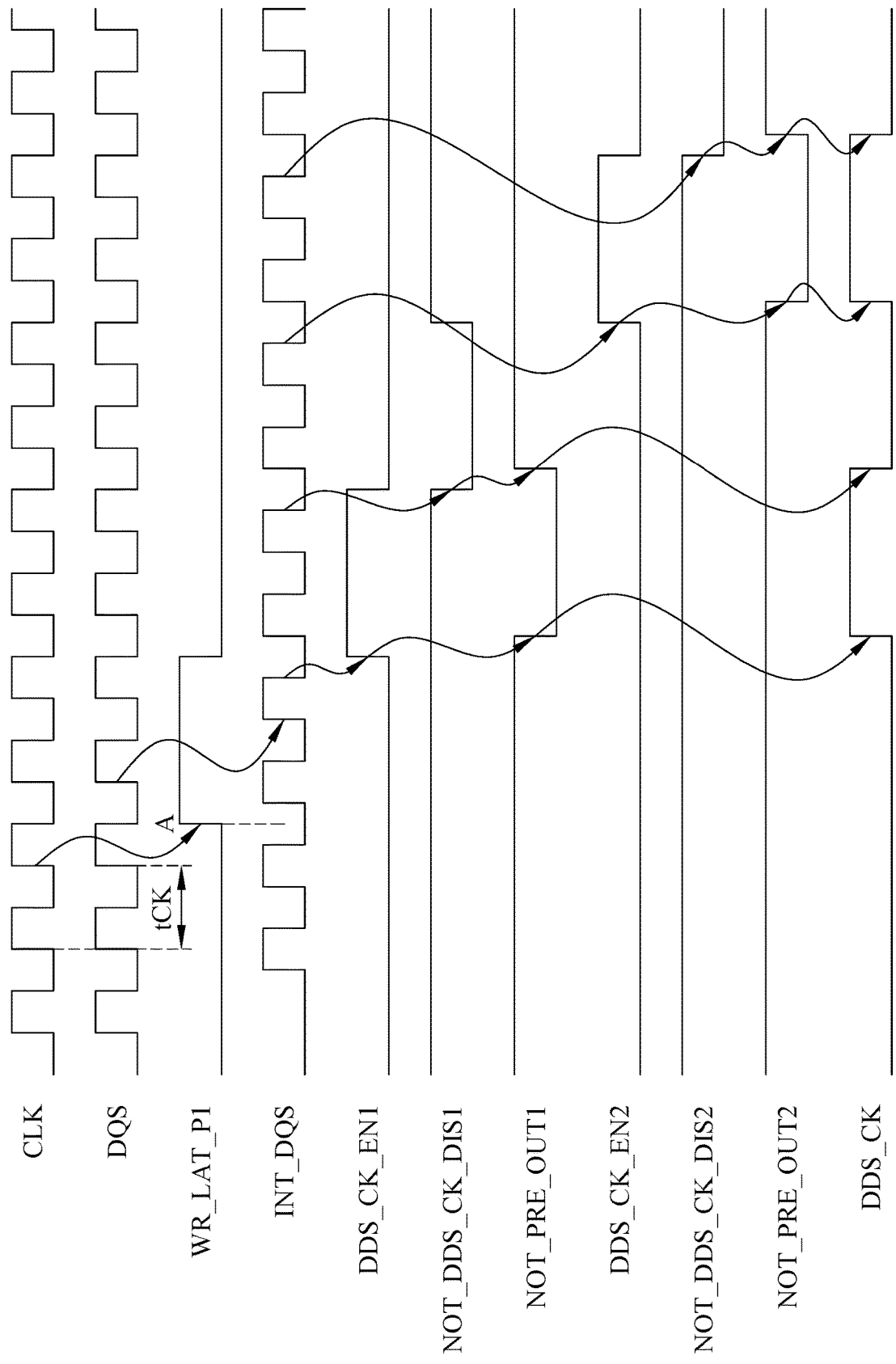
FIG. 9 is a timing diagram illustrating a method for generating the latch signal of the internal latch circuit of one or more exemplary embodiments of the present invention.

For example, please refer to FIG. 9 together with FIG. 4 to FIG. 8B. FIG. 9 is a timing diagram illustrating a method for generating a latch signal of an internal latch circuit according to one or more exemplary embodiments of the present invention. As shown in FIG. 7, the input delay signal WR_LAT_P1 first has a low initial value L, and responds to the clock signal CLK at time point A, so that the input delay signal WR_LAT_P1 is changed to a high value H; after two time cycles tCK, since the input delay signal WR_LAT_P1 is input into the first low initial value D flip-flop 11 and the second low initial value D flip-flop 12, the first low initial value D flip-flop 11 based on an internal strobe data signal INT_DQS responds to the input delay signal WR_LAT_P1, so that the first internal input signal DDS_CK_EN1 output by the second low initial value D flip-flop 12 is changed to a high value H, and the first internal input signal DDS_CK_EN1 is simultaneously input to the internal latch signal generating circuit 5, so that the first reverse pre-output signal NOT_PRE_OUT1 is changed to a low value L, so that the latch signal DDS_CK is changed to a high value H; after four time cycles tCK, since the input delay signal WR_LAT_P1 is input into the first low initial value D flip-flop 11, the second low initial value D flip flop 12, the first high initial value D flip flop 21 and the third low initial value D flip flop 13, so that the first reverse internal input signal NOT_DDS_CK_DIS1 output by the third low initial value D flip-flop 13 is changed to a low value L, and the first internal input signal DDS_CK_EN1 is simultaneously input to the internal latch signal generating circuit 5, so that the first reverse pre-output signal NOT_PRE_OUT1 is changed to a high value H, so that the latch signal DDS_CK is changed to a low value L; after six time cycles tCK, since the input delay signal WR_LAT_P1 is input to the first low initial value D flip-flop 11, the second low initial value D flip-flop 12, the first high initial value D flip-flop 21, the third low initial value D flip-flop 13, the second high initial value D flip-flop 22 and the fourth low initial value D flip-flop 14, so that the second internal input signal DDS_CK_EN2 output by the fourth low initial value D flip-flop 14 is changed to a high value H, and the second internal input signal DDS_CK_EN2 is simultaneously input to the internal latch signal generating circuit 5, so that the second Reverse pre-output signal NOT_PRE_OUT2 is changed to a low value L, so that the latch signal DDS_CK is changed to a high value H; after eight time cycles tCK, since the input delay signal WR_LAT_P1 is input to the first low initial value D flip-flop 11, the second low initial value D flip flop 12, the first high initial value D flip flop 21, the third low initial value D flip flop 13, the second high initial value D flip-flop 22, the fourth low initial value D flip-flop 14, the third high initial value D flip-flop 23, and the fifth low initial value D flip-flop 15, so that the second reverse internal input signal NOT_DDS_CK_DIS2 output by the fifth low initial value D flip-flop 153 is changed to a low value L, and the second reverse internal input signal NOT_DDS_CK_DIS2 is simultaneously input to the internal latch signal generating circuit 5, so that the second reverse pre-output signal NOT_PRE_OUT2 is changed to a high value H, so that the latch signal DDS_CK is changed to a low value L.

It needs to be mentioned that it can be obtained from the above description that the latch signal DDS_CK generated by the internal latch circuit 100 according to the present invention begins as the input delay signal WR_LAT_P1 responds to the clock signal CLK at time point A, and within the next four time cycles tCK, the latch signal DDS_CK is only generated by the first low initial value D flip-flop 11, the second low initial value D flip-flop 12, and the first high initial value D flip-flop 21, the third low initial value D flip-flop 13, the internal latch signal generating circuit 5 and the NAND gate 6. In addition, it begins four time cycles tCK after the time point A, and within the next eight time cycles tCK, the latch signal DDS_CK is only generated by the second high initial value D flip-flop 22, the fourth low initial value D flip-flop 14, and the third high initial value D flip-flop 23, the fifth low initial value D flip-flop 15, the internal latch signal generating circuit 5 and the NAND gate 6, but the invention is not thus limited.

Accordingly, it can be known from the above description that according to the internal latch circuit 100 provided by the present invention and the method for generating the latch signal DDS_CK thereof, in the process of generating the internal latch signal DDS_CK, the internal latch the internal latch circuit 100 only responds to the rising edge of the input delay signal WR_LAT_P1 and is not affected by the falling edge of the input delay signal WR_LAT_P1. More specifically, as to the internal latch signal DDS_CK generated by the internal latch circuit 100 of the present invention, the two-channel synchronous dynamic random access memory performs write operations stably without affected by the change of the rising edge and the falling edge of the input delay signal WR_LAT_P1 caused by the temperature of the external environment or the manufacturing technology of the metal oxide semiconductor field effect transistor. By means of the internal latch circuit 100 of the present invention together with the method of generating the latch signal DDS_CK thereof, the two-channel synchronous dynamic random access memory will not be affected by the manufacturing technology and the external environment temperature, and through the accurate internal latch signal DDS_CK, the write operation can be performed stably by accurate internal latch signal DDS_CK.

It is worth further mentioning that in another embodiment of the present invention, the input delay signal WR_LAT_P1 causes the change of the rising edge and the falling edge of the input delay signal WR_LAT_P1 by the temperature of the external environment or the manufacturing technology of the metal oxide semiconductor field effect transistor. However, the internal latch circuit 100 provided by the present invention together with the method for generating the latch signal DDS_CK thereof, which is used according to the above steps, still can generate the correct latch signal DDS_CK to perform the write operation stably. Steps S1, S2, S3, S4, S5, S6, S7 etc., have been described as above, and the description will not be repeated here.

Accordingly, the present invention has the following implementation effects and technical effects:

First, by means of the internal latch circuit 100 of the present invention together with the method of generating the latch signal DDS_CK thereof, the two-channel synchronous dynamic random access memory will not be affected by the manufacturing technology and the external environment temperature, and through the accurate internal latch signal DDS_CK, the write operation can be performed stably by accurate internal latch signal DDS_CK.

Second, compared to the internal latch circuit of the prior art, the internal latch circuit 100 of the present invention only adds simple elements so that the internal latch circuit 100 according to the present invention can be easily implemented by those with ordinary knowledge in the art and has the effects of simple implementation and low cost.

Third, the internal latch circuit 100 of the present invention used together with the method for generating the latch signal DDS_CK eliminates the influence of changes in the delay time tDQSS of the input delay signal on the two data rates SDRAM so as to reduce the influence of the delay time tDQSS on the two data rates SDRAM when performing write operation.

The above is to illustrate the implementation of the present invention through specific embodiments, those with ordinary knowledge in the art can easily understand other advantages and effects of the present invention from the content disclosed in this specification.

Although the present invention is described with reference to the embodiments depicted in the drawings, it is only an embodiment, and a person with ordinary knowledge in the art should understand that variation and modifications can be made. However, these variations and modifications should not depart from the protected scope of the present invention. Therefore, the scope of protection of the present invention must be limited to the scope of the attached claims.

What is claimed is:

1. An internal latch circuit comprising:
a first delay circuit receiving an input delay signal and an internal data strobe signal, and outputting a first internal input signal, wherein the input delay signal responds to a clock signal;
a second delay circuit coupled to the first delay circuit, the second delay circuit receiving the internal data strobe signal, and outputting a first reverse internal input signal;
a third delay circuit coupled to the second delay circuit, and receiving the internal data strobe signal and outputting a second internal input signal;
a fourth delay circuit coupled to the third delay circuit, and receiving the internal data strobe signal and outputting a second reverse internal input signal;
an internal latch signal generating circuit coupled to the first delay circuit, the second delay circuit, the third delay circuit, and the fourth delay circuit, and generating a first reverse pre-output signal according to the first internal input signal and the first reverse internal input signal, and generating a second reverse pre-output signal according to the second internal input signal and the second reverse internal input signal; and
a NAND gate coupled to the internal latch signal generating circuit, and generating an internal latch signal according to the first reverse pre-output signal and the second reverse pre-output signal.

2. The internal latch circuit of claim 1, wherein the first delay circuit, the second delay circuit, the third delay circuit, and the fourth delay circuit are implemented with at least one of D flip-flop, JK flip-flop and SR flip-flop.

3. The internal latch circuit of claim 1, further comprising a reset input terminal coupled to the first delay circuit, the second delay circuit, the third delay circuit, and the fourth delay circuit, the reset input terminal is used to input a reverse reset signal.

4. The internal latch circuit of claim 1, having a plurality of low initial value D flip-flops and a plurality of high initial value D flip-flops, and comprising:
- a first low initial value D flip-flop receiving the input delay signal and the internal data strobe signal, wherein the input delay signal responds to the clock signal;
- a second low initial value D flip-flop coupled to the first low initial value D flip-flop, the second low initial value D flip-flop receiving the internal data strobe signal, and outputting the first internal input signal;
- a first high initial value D flip-flop coupled to the second low initial value D flip-flop, and the first high initial value D flip-flop receiving the internal data strobe signal;
- a third low initial value D flip-flop coupled to the first high initial value D flip-flop, the third low initial value D flip-flop receiving the internal data strobe signal, and outputting the first reverse internal input signal;
- a second high initial value D flip-flop coupled to the third low initial value D flip-flop, and the second high initial value D flip-flop receiving the internal data strobe signal;
- a fourth low initial value D flip-flop coupled to the second high initial value D flip-flop, the fourth low initial value D flip-flop receiving the internal data strobe signal, and outputting the second internal input signal;
- a third high initial value D flip-flop coupled to the fourth low initial value D flip-flop, and the third high initial value D flip-flop receiving the internal data strobe signal;
- a fifth low initial value D flip-flop coupled to the third high initial value D flip-flop, the fifth low initial value D flip-flop receiving the internal data strobe signal, and outputting the second reverse internal input signal;
- wherein the first low initial value D flip-flop and the second low initial value D flip-flop consist of the first delay circuit, the first high initial value D flip-flop and the third low initial value D flip-flop consist of the second delay circuit, the second high initial value D flip-flop and the fourth low initial value D flip-flop consist of the third delay circuit, the third high initial value D flip-flop and the fifth low initial value D flip-flop consist of the fourth delay circuit.

5. The internal latch circuit of claim 4, wherein each of the low initial value D flip-flops and the high initial value D flip-flops has an input terminal, an output terminal, a reverse output terminal, and an internal data strobe input terminal.

6. A method for generating a latch signal, which is applied to the internal latch circuit of claim 1, comprising the steps of:
- receiving the input delay signal and the internal data strobe signal;
- using a plurality of low initial value D flip-flops and a plurality of high initial value D flipflops to generate and transmit the first internal input signal, the first reverse internal input signal, the second internal input signal, and the second reverse internal input signal to the internal latch signal generating circuit based on the internal data strobe signal and in response to the input delay signal;
- using the internal latch signal generating circuit to receive the first internal input signal, the first reverse internal input signal, and the second internal input signal and the second reverse internal input signal, so that the internal latch signal generating circuit outputs the first reverse pre-output signal and the second reverse pre-output signal; and
- using the NAND gate to receive the first reverse pre-output signal and the second reverse pre-output signal to generate the internal latch signal.

7. The method for generating a latch signal of claim 6, wherein the first delay circuit, the second delay circuit, the third delay circuit, and the fourth delay circuit are implemented with at least one of D flip-flop, JK flip-flop and SR flip-flop.

8. The method for generating a latch signal of claim 6, wherein the internal latch circuit further includes a reset input terminal coupled to the first delay circuit, the second delay circuit, the third delay circuit and the fourth delay circuit, and the reset input terminal is used to input a reverse reset signal.

9. The method for generating a latch signal of claim 6, further comprising the steps of:
- receiving the input delay signal by the internal latch circuit, which responds to the clock signal;
- inputting the input delay signal to a first low initial value D flip-flop and a second low initial value D flip-flop, wherein the second low initial value D flip-flop outputs the first internal input signal in response to the input delay signal based on the internal data strobe signal after two time cycles, and the first internal input signal is delayed by two time cycles compared with the input delay signal;
- inputting the input delay signal to the first low initial value D flip-flop, the second low initial value D flip-flop, a first high initial value D flip-flop and a third low initial value D flip-flop, wherein the third low initial value D flip-flop outputs the first reverse internal input signal in response to the input delay signal based on the internal data strobe signal after four time cycles, and the first reverse internal input signal is a reverse signal and delayed by four time cycles compared with the input delay signal;
- inputting the input delay signal to the first low initial value D flip-flop, the second low initial value D flip-flop, the first high initial value D flip-flop, the third low initial value D flip-flop, a second high initial value D flip-flop and a fourth low initial value D flip-flop, wherein the fourth low initial value D flip-flop outputs the second internal input signal in response to the input delay signal based on the internal data strobe signal after six time cycles, and the second internal input signal is delayed by six time cycles compared with the input delay signal;
- inputting the input delay signal to the first low initial value D flip-flop, the second low initial value D flip-flop, the first high initial value D flip-flop, the third low initial value D flip-flop, the second high initial value D flip-flop, the fourth low initial value D flip-flop, a third high initial value D flip-flop and a fifth low initial value D flip-flop, wherein the fifth low initial value D flip-flop outputs the second reverse internal input signal in response to the input delay signal based on the internal data strobe signal after eight time cycles, and the second reverse internal input signal is a reverse signal and delayed by eight time cycles compared with the input delay signal;
- inputting the first internal input signal and the first reverse internal input signal to the internal latch signal generating circuit to generate the first reverse pre-output signal, and inputting the second internal input signal and the second reverse internal input signal to the internal latch signal generating circuit to generate the second reverse pre-output signal; and inputting the first reverse pre-output signal and the second reverse pre-output signal to the NAND gate, and generating the internal latch signal.

10. The method for generating the latch signal of claim 9, wherein each of the low initial value D flip-flops and the high initial value D flip-flops has an input terminal, an output terminal, a reverse output terminal, and an internal data strobe input terminal.

* * * * *